(12) United States Patent
Vice

(10) Patent No.: US 6,987,422 B2
(45) Date of Patent: Jan. 17, 2006

(54) EQUAL PHASE MULTIPLE GAIN STATE AMPLIFIER

(75) Inventor: Michael W. Vice, El Granada, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 30 days.

(21) Appl. No.: 10/438,592

(22) Filed: May 15, 2003

(65) Prior Publication Data

US 2004/0227576 A1  Nov. 18, 2004

(51) Int. Cl.
*H03G 3/30* (2006.01)
*H03F 1/22* (2006.01)
(52) U.S. Cl. .................... 330/285; 330/310; 330/311
(58) Field of Classification Search ............... None
See application file for complete search history.

(56) References Cited

U.S. PATENT DOCUMENTS

| 5,903,854 A | * | 5/1999 | Abe et al. .................... 330/295 |
| 5,942,946 A | * | 8/1999 | Su et al. ...................... 330/285 |
| 6,501,331 B2 | * | 12/2002 | Adar ............................ 330/51 |

FOREIGN PATENT DOCUMENTS

JP          02000101371 A  *  4/2000

* cited by examiner

*Primary Examiner*—Khanh V. Nguyen

(57) ABSTRACT

A multiple gain state amplifier that provides advantageous port matching, noise characteristics, and current savings while not imposing a phase shift in the amplifier transfer function between gain states. A multiple gain state amplifier according to the present teachings includes amplifier circuit configured for a first gain state using a first transistor and configured for a second gain state using a second transistor and a circuit for changing the amplifier circuit between the first gain state and the second gain state by selectively applying a bias to the first transistor and a bias to the second transistor.

14 Claims, 2 Drawing Sheets

EQUAL PHASE MULTIPLE GAIN STATE AMPLIFIER

BACKGROUND OF THE INVENTION

1. Field of Invention

The present invention pertains to the field of electronic amplifiers. More particularly, this invention relates to amplifiers having multiple gain states.

2. Art Background

It is often desirable in a variety of electronic systems to employ an amplifier that is capable of multiple gain states. For example, it is often desirable in a radio receiver to employ an amplifier having a high gain state that may be used when a received signal is relatively weak and a low gain state that may be used when a received signal is relatively strong. Such changes in received signal strength may be caused, for example, by movement of a mobile radio to different distances relative to its base station.

Some prior multiple gain state amplifiers employ an attenuator and a switch that opens and closes to add or remove the attenuator from an input signal path to the amplifier. Unfortunately, such prior amplifiers usually suffer from the excessive noise and signal loss caused by the switch. Moreover, such prior amplifiers typically consume full electrical current in both the high and low gain states which may cause excessive power consumption in a mobile device.

Other prior multiple gain state amplifiers employ a bypass switch to route an input signal directly from the input to the output of the amplifier to provide the low gain state. Typically, such a bypass switch arrangement causes a 180-degree phase shift in the transfer function of the amplifier between high and low gain states. Unfortunately, such an abrupt phase shift when it occurs in digital communications typically causes undesirable phase changes in a base band data stream. Moreover, such prior amplifier usually imposes difficulties in maintaining an impedance match at the amplifier input/output ports.

Still other prior multiple gain state amplifiers employ mechanisms for switching the gain of the amplifier by switching different values of series or shunt feedback resistance, bias voltages, etc. Unfortunately, such techniques typically have an undesirable impact on input and output port impedance match.

Other prior multiple gain state amplifiers employ multiple amplifiers and switches for switching an input signal path among the amplifiers. Unfortunately, such amplifiers typically suffer from the excessive noise and signal loss caused by the switches. In addition, such techniques typically increase the hardware costs due to the presence of the additional amplifiers and related components.

SUMMARY OF THE INVENTION

A multiple gain state amplifier is disclosed that provides advantageous port matching, noise characteristics, and current savings while not imposing a phase shift in the amplifier transfer function when gain states are changed. A multiple gain state amplifier according to the present teachings includes amplifier circuit configured for a first gain state using a first transistor and configured for a second gain state using a second transistor and a circuit for changing the amplifier circuit between the first gain state and the second gain state by selectively applying a bias to the first transistor and a bias to the second transistor.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
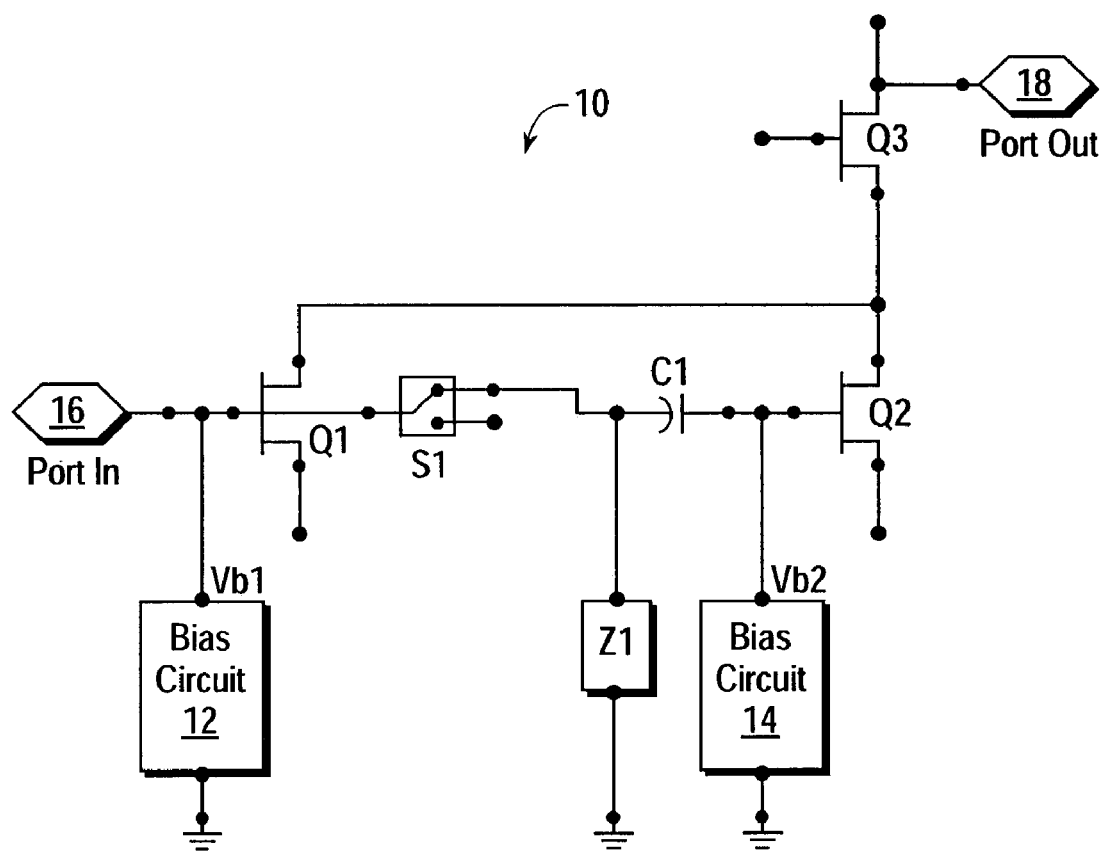
FIG. 1 shows a multiple gain state amplifier according to the present teachings.

FIG. 1 shows a multiple gain state amplifier 10 according to the present teachings. The multiple gain state amplifier 10 in one embodiment provides two gain states—a high gain state and a low gain state. The present teachings may nevertheless be extended to amplifiers with more than two gain states.

The multiple gain state amplifier 10 is configured for a cascode topology that includes a transistor Q3 together with either a transistor Q1 or a transistor Q2. An on/off state of a switch S1 determines whether the transistor Q1 or the transistor Q2 is active in the cascode arrangement.

The transistor Q1 is biased by a bias circuit 12 and the transistor Q2 is biased by a bias circuit 14. The transistor Q1 is a relatively large transistor in comparison to the transistor Q2. The bias circuit 12 is configured to bias the transistor Q1 to a substantially higher current level in comparison to the current level to which the bias circuit 14 is configured to bias the transistor Q2.

The multiple gain state amplifier 10 is set to a high gain state by opening the switch S1. When the switch S1 is open and when the bias from bias circuit 14 is shut down, a bias voltage Vb2 from the bias circuit 14 is removed and the transistor Q2 is inactive. Thus, when the switch S1 is open the cascode is composed of the transistors Q1 and Q3 along with the bias circuit 12 that applies a bias voltage Vb1 to the transistor Q1. This configuration that includes the relatively large and high current state of the transistor Q1 provides a relatively high gain cascode amplifier between an input node 16 to an output node 18 of the multiple gain state amplifier 10.

The multiple gain state amplifier 10 is set to a low gain state by closing the switch S1 and turning off the bias voltage Vb1 and turning on the bias voltage Vb2. Under these circumstances the transistor Q1 is switched off and is effectively absent from the circuit and the signal at the input node 16 is coupled to the transistor Q2 through the switch S1 and the capacitor C1. This selects the transistor Q2 to form a cascode with the transistor Q3 which yields a relatively low gain because the transistor Q2 is substantially smaller than the transistor Q1 and is biased to a substantially lower current. Residual gain may be reduced via a load Z1 which may be a shunt resistor. This low gain state still provides a 180 degree phase shift between the input and output nodes 16 and 18 as does the high gain state so that the transfer phase of the multiple gain state amplifier 10 in each state is substantially similar.

Given its cascode topology the output impedance of the multiple gain state amplifier 10 is largely determined by the characteristics of the transistor Q3 which does not change substantially between the high and low gain states.

When the switch S1 is open, no switching element is in the signal path between the input and output nodes 16 and 18. Thus the noise of the multiple gain state amplifier 10 is not adversely effected by the presence of the low gain circuitry as are prior art multiple gain state amplfiers. Judicious choices of transistor sizes, bias currents, feedback, and matching networks may be used to optimize the noise figure, gain, port match, linearity, and current consumption of the multiple gain state amplifier 10. The transistor Q2 is chosen to be smaller in size than the transistor Q1, and the bias voltage Vb2 is adjusted to produce greatly reduced current in the transistor Q3 compared to the high gain state. The load Z1 is optional and is positioned at the input of the multiple gain state amplifier 10 to restore input port match and to mitigate the small amount of gain provided by the transistor Q2.

The cascode topology in the multiple gain state amplifier 10 provides a relatively stable port match at the output node 18 in the high and low gain states. The multiple gain state amplifier 10 exhibits substantially zero phase shift difference between the high and low gain states because each state functions as an active amplifier with substantially the same topology. The input compression point may be very similar in both high and low gain states if the gain and current consumption are made to drop by the same ratio. This is because the output compression point drops by the ratio of the current consumption, and the reduction in gain preserves the input compression point. It is the input compression point that is relevant to receive chain linearity.

The sources of the transistors Q1 and Q2 may be tied together directly to ground or through inductors.

Figure 2:
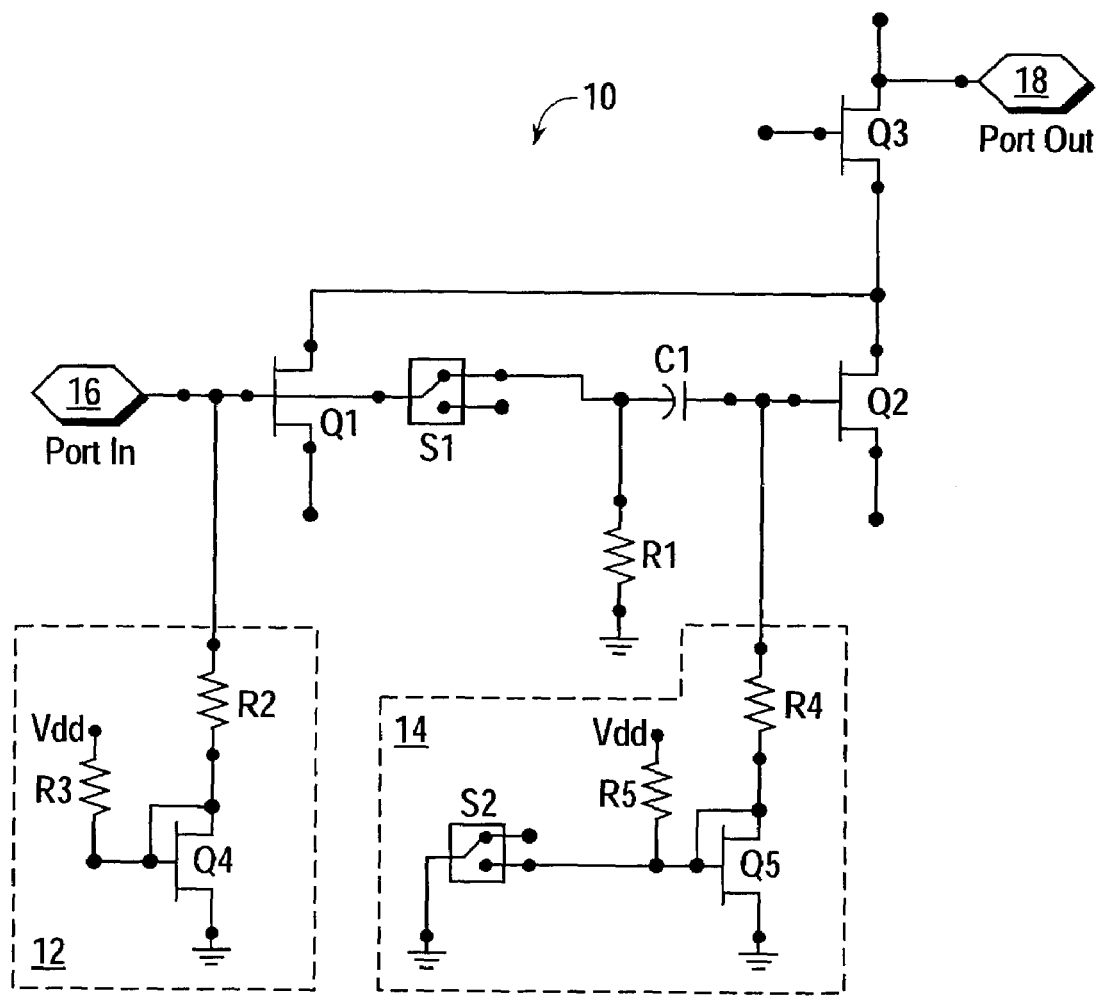
FIG. 2 shows the biasing elements in one embodiment of a multiple gain state amplifier according to the present teachings.

FIG. 2 shows the bias circuits 12 and 14 in one embodiment of the multiple gain state amplifier 10. Each bias circuit 12–14 in this embodiment is arranged as a current mirror circuit. The current mirror elements in the bias circuit 12 include a transistor Q4 and a pair of resistors R2–R3. The current mirror elements in the bias circuit 14 include a transistor Q5 and a pair of resistors R4–R5. The impedance Z1 is shown as resistor R1.

The multiple gain state amplifier 10 in this embodiment includes a switch S2 for switching on/off the bias supply Vb2 from the bias circuit 14. The switching of the bias circuit 12 is accomplished automatically by the switch S1 and the resistor R1. When the switch S1 is closed, R1 effectively shorts out the bias supply Vb1 from the bias circuit 12. The shorting out of the bias supply Vb1 from the bias circuit 12 may be enhanced by selecting the resistor R2 to have a substantially greater value than the resistor R1. The actuation of the switches S1 and S2 may be coordinated so as to switch together in complementary fashion.

The switches S1 and S2 may be implemented as field effect transistors (FETs) or some other type of device. The transistors Q1–Q5 may be FETs or bipolar junction transistors (BJTs).

The multiple gain state amplifier 10 yields no substantial degradation of a noise figure in the high gain state while providing a good impedance port match in the high and low gain states. Moreover, the multiple gain state amplifier 10 yields a high degree of electrical current savings in the low gain state with no phase change between the input and output ports between the high and low gain states.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A multiple gain state amplifier, comprising:
    amplifier circuit configured for a first gain state using a first transistor and configured for a second gain state using a second transistor;
    circuit for changing the amplifier circuit between the first gain state and the second gain state by selectively applying a bias to the first transistor and a bias to the second transistor wherein the circuit for changing comprises a first bias circuit for applying the bias to the first transistor and a second bias circuit for applying the bias to the second transistor and a circuitry for switching on/off the first and second bias circuits, wherein the amplifier circuit provides the first gain state using a cascode arrangement of the first transistor and an output transistor.

2. The multiple gain state amplifier, comprising:
    amplifier circuit configured for a first gain state using a first transistor and configured for a second gain state using a second transistor;
    circuit for changing the amplifier circuit between the first gain state and the second gain state by selectively applying a bias to the first transistor and a bias to the second transistor wherein the circuit for changing comprises a first bias circuit for applying the bias to the first transistor and a second bias circuit for applying the bias to the second transistor and a circuitry for switching on/off the first and second bias circuits, wherein the amplifier circuit provides the second gain state using a cascode arrangement of the second transistor and an output transistor.

3. The multiple gain state amplifier of claim 2, wherein the first transistor is larger than the second transistor.

4. The multiple gain state amplifier of claim 2, wherein the bias to the first transistor provides a higher level of current than the bias to the second transistor.

5. The multiple gain state amplifier of claim 2, further comprising a circuit for reducing an amount of gain in the second gain state.

6. The multiple gain state amplifier of claim 2, wherein a phase shift between an input node and an output node of the amplifier circuit in the first gain state is substantially similar to a phase shift between the input node and the output node in the second gain state.

7. The multiple gain state amplifier, comprising:
    amplifier circuit configured for a first gain state using a first transistor and configured for a second gain state using a second transistor;
    circuit for changing the amplifier circuit between the first gain state and the second gain state by selectively applying a bias to the first transistor and a bias to the second transistor wherein the circuit for changing comprises a first bias circuit for applying the bias to the first transistor and a second bias circuit for applying the bias to the second transistor and a circuitry for switching on/off the first and second bias circuits, wherein the amplifier circuit includes a cascode arrangement of the first transistor and the second transistor and an output transistor such that an output impedance of the amplifier circuit is substantially determined by the output transistor for both the first and the second gain states.

8. A method for providing a multiple gain state amplifier, comprising:
    configuring an amplifier circuit for a first gain state using a first transistor and for a second gain state using a second transistor;

changing the amplifier circuit between the first gain state and the second gain state by selectively applying a bias to the first transistor and a bias to the second transistor wherein changing includes applying the bias to the first transistor using a first bias circuit and applying the bias to the second transistor using a second bias circuit and switching on/off the first and second bias circuits, wherein configuring an amplifier circuit comprises arranging the amplifier circuit in a cascode topology that includes the first transistor and an output transistor.

9. A method for providing a multiple gain state amplifier, comprising:

configuring an amplifier circuit for a first gain state using a first transistor and for a second gain state using a second transistor;

changing the amplifier circuit between the first gain state and the second gain state by selectively applying a bias to the first transistor and a bias to the second transistor wherein changing includes applying the bias to the first transistor using a first bias circuit and applying the bias to the second transistor using a second bias circuit and switching on/off the first and second bias circuits, wherein configuring an amplifier circuit comprises arranging the amplifier circuit in a cascode topology that includes the first transistor and an output transistor.

10. The method of claim 9, wherein selectively applying includes switching on/off a bias circuit for the first transistor.

11. The method of claim 9, wherein selectively applying includes switching on/off a bias circuit for the first transistor.

12. The method of claim 9, wherein configuring an amplifier circuit includes selecting the first transistor to be larger than the second transistor.

13. The method of claim 9, wherein configuring an amplifier circuit includes configuring the bias to the first transistor to a higher level of current than the bias to the second transistor.

14. The method of claim 9, further comprising reducing an amount of gain in the second gain state.

\* \* \* \* \*

UNITED STATES PATENT AND TRADEMARK OFFICE
CERTIFICATE OF CORRECTION

| | | |
|---|---|---|
| PATENT NO. | : 6,987,422 B2 | Page 1 of 1 |
| APPLICATION NO. | : 10/438592 | |
| DATED | : January 17, 2006 | |
| INVENTOR(S) | : Michael W. Vice | |

It is certified that error appears in the above-identified patent and that said Letters Patent is hereby corrected as shown below:

Column 4, Line 17 (Approx.), Claim 2, delete "The" and insert -- A --;

Column 4, Line 46 (Approx.), Claim 7, delete "The" and insert -- A --;

Column 6, Line 5, Claim 9, delete "first" and insert -- second --;

Column 6, Line 9, Claim 11, delete "first" and insert -- second --.

Signed and Sealed this
Twenty-sixth Day of February, 2013

Teresa Stanek Rea
*Acting Director of the United States Patent and Trademark Office*